(12) United States Patent
Latham

(10) Patent No.: US 9,958,482 B1
(45) Date of Patent: May 1, 2018

(54) SYSTEMS AND METHODS FOR A HIGH ISOLATION CURRENT SENSOR

(71) Applicant: Allegro MicroSystems, LLC, Worcester, MA (US)

(72) Inventor: Alexander Latham, Harvard, MA (US)

(73) Assignee: Allegro MicroSystems, LLC, Worcester, MA (US)

( * ) Notice: Subject to any disclaimer, the term of this patent is extended or adjusted under 35 U.S.C. 154(b) by 0 days. days.

(21) Appl. No.: 15/384,427

(22) Filed: Dec. 20, 2016

(51) Int. Cl.
*G01R 1/20* (2006.01)
*G01R 15/20* (2006.01)
*G01R 19/00* (2006.01)

(52) U.S. Cl.
CPC ......... *G01R 15/207* (2013.01); *G01R 15/202* (2013.01); *G01R 15/205* (2013.01); *G01R 19/0092* (2013.01)

(58) Field of Classification Search
CPC .. G01R 15/183; G01R 15/202; G01R 15/207; G01R 15/14; G01R 15/20; G01R 19/0092; G01R 13/02; G01R 21/08; G01R 11/32; G01R 33/18; G01R 33/02; H01L 41/12; H01L 41/16; H02K 41/06
USPC ........ 324/260, 249, 109, 235, 117 R, 117 H, 324/244, 251, 207.12–207.13, 207.2, 324/207.21
See application file for complete search history.

(56) References Cited

U.S. PATENT DOCUMENTS

| | | | |
|---|---|---|---|
| 4,937,521 A * | 6/1990 | Yoshino | G01R 15/205 324/117 R |
| 6,462,531 B1 * | 10/2002 | Ohtsuka | H01L 43/065 257/E43.003 |
| 6,812,687 B1 * | 11/2004 | Ohtsuka | H01L 43/065 257/E43.003 |
| 6,995,315 B2 | 2/2006 | Sharma et al. | |
| 7,259,545 B2 | 8/2007 | Stauth et al. | |
| 7,476,816 B2 | 1/2009 | Doogue et al. | |
| 7,518,354 B2 | 4/2009 | Stauth et al. | |
| 7,746,056 B2 | 6/2010 | Stauth et al. | |
| 8,604,777 B2 | 12/2013 | Doogue et al. | |
| 8,907,437 B2 | 12/2014 | Milano et al. | |
| 2005/0224248 A1 * | 10/2005 | Gagnon | G01R 15/207 174/529 |

(Continued)

OTHER PUBLICATIONS

U.S. Appl. No. 15/363,285, filed Nov. 29, 2016, Milano, et al.

*Primary Examiner* — Thang Le
(74) *Attorney, Agent, or Firm* — Daly, Crowley, Mofford & Durkee, LLP

(57) ABSTRACT

Systems and methods are described herein for creating a high isolation integrated current sensor whereby a portion of a current to be sensed by a magnetic field sensing circuit is split within the current sensor. The current sensor includes a primary conductor configured to carry a first portion of a primary current and a semiconductor substrate having a first surface and a second opposing surface. The first surface supports a magnetic field sensing circuit. The current sensor includes a first insulation layer disposed over the first surface, a conductive layer disposed over the first insulation layer and at least two interconnects coupled between the primary conductor and the conductive layer. A second portion of the primary current can flow through the conductive layer and the magnetic field sensing circuit is configured to sense the second portion of primary current.

28 Claims, 7 Drawing Sheets

(56) References Cited

U.S. PATENT DOCUMENTS

| | | | | |
|---|---|---|---|---|
| 2009/0295368 A1* | 12/2009 | Doogue | ............... | G01R 15/207 |
| | | | | 324/117 H |
| 2013/0015843 A1* | 1/2013 | Doogue | ............... | G01R 15/148 |
| | | | | 324/202 |
| 2015/0243882 A1* | 8/2015 | Doogue | ................ | B82Y 25/00 |
| | | | | 257/427 |

* cited by examiner

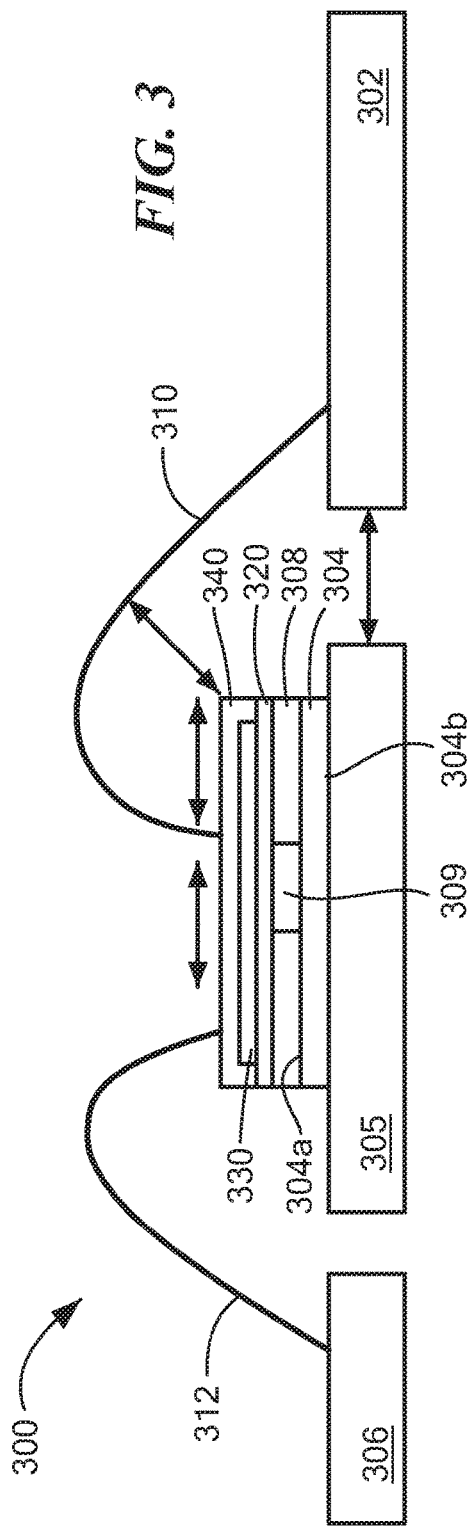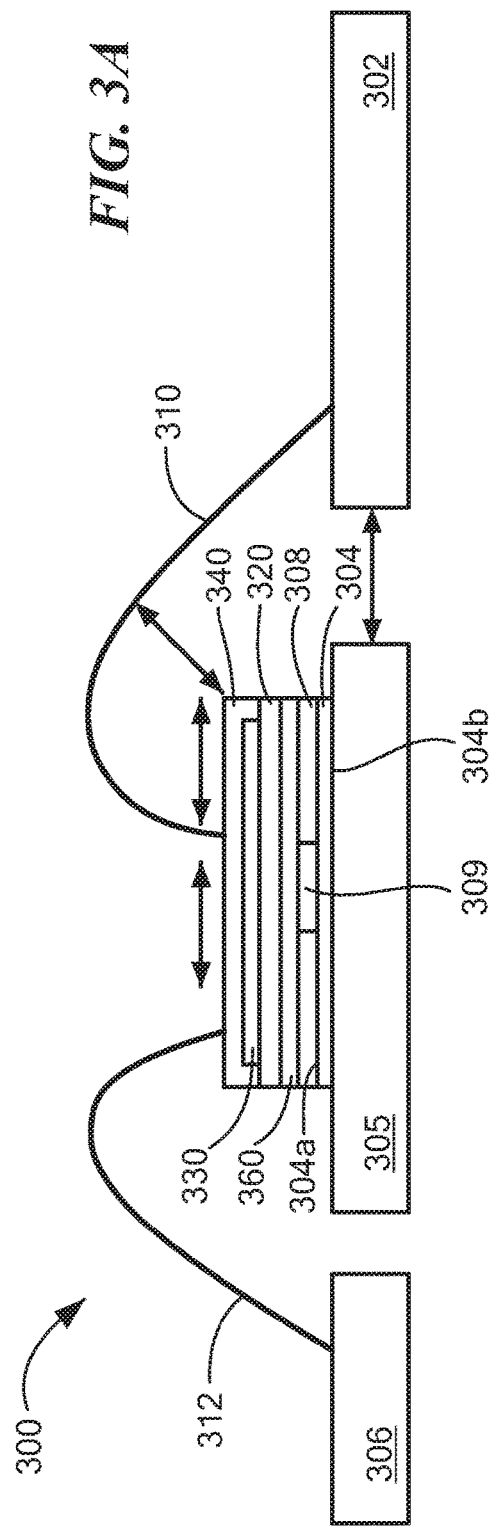

SYSTEMS AND METHODS FOR A HIGH ISOLATION CURRENT SENSOR

BACKGROUND

As is known in the art, some current sensors use a magnetic field sensing element in proximity to a current conductor. The sensing element can generate an output signal having a magnitude proportional to the magnetic field induced by a current that flows through the current conductor.

Various parameters characterize the performance of current sensors, including sensitivity. Sensitivity is related to the magnitude of a change in output voltage from the sensing element in response to a change in the sensed current. The sensitivity of a current sensor can be influenced by a variety of factors, including is a physical distance between the sensing element and the conductor.

Further, current sensors typically have a limited operational range with respect to an amount of current they can sense and thus measure. However, some applications may require sensing currents at amounts greater than the operational range of the respective current sensor.

SUMMARY

Systems and methods described herein are directed towards creating a high isolation integrated current sensor whereby a portion of a current is directly sensed by a magnetic field sensing circuit of the current sensor. A primary current provided to a current sensor can be split or otherwise portioned such that only a portion of the current to be sensed that is within an operational range of the respective current sensor is brought into proximity to the sensing circuit. Thus, the current sensors as described herein can be configured for applications requiring the sensing of larger current (e.g., greater than a respective operational range of the respective current sensor) by splitting the current to be sensed.

The current can be split by wire-bonding from a primary current path carrying a primary current to a conductive layer formed on the current sensor. The wire-bonding can form a secondary path to provide a portion of the primary current to the conductive layer. Thus, a first portion of the primary current can flow through the primary current path and a different second portion of the primary current can flow through a path created by the conductive layer. The second portion of the primary current flowing through the conductive layer can be sensed by a magnetic field sensing circuit formed on the current sensor. The conductive layer can be electrically isolated from the magnetic field sensing element(s) and circuitry using one or more isolation layers (e.g., polyimide) and/or a redistribution layer.

The portion of the current being measured is split and thus the magnetic field sensing circuit may sense the field from the portion of the current that is provided to the conductive layer. In some applications, for example those having a current greater than a sensing threshold/limit of the respective current sensor, the current splitting may split or otherwise reduce an amount of the current to be sensed by the magnetic field sensing circuit such that it is within the operational range of the respective current sensor. For example, in applications using one or more giant magnetoresistance (GMR) elements, the GMR has a linear range, thus splitting the current allows the current to be sensed to stay in the linear region even in the presence of a larger primary current that is greater than that linear range.

In an embodiment, the current splitting is performed within the current sensor package. Thus, all of the primary current is provided to and flows through the current sensor. Properties of different components of the current sensor can be modified to control an amount or percentage of the current that is split within the current sensor package and provided to the conductive layer. For example, resistance values of the wire-bonds coupling the primary current path to the conductive layer can be modified to control an amount or percentage of the current that is split. In some embodiments, properties (e.g., material, thickness, length, width) of the primary current path and/or the conductive layer can be modified to control an amount or percentage of the current that is split.

The current sensor can be configured to perform differential sensing. For example, the magnetic field sensing circuit can be configured to sense a magnetic field corresponding to the second portion of the primary current in at least two directions. For example, by bringing the second portion of the primary current to the conductive layer disposed over the magnetic field sensing circuit, the conductive layer can generate magnetic fields on one or more magnetic field sensing elements in different (e.g., opposite) directions to sense to second portion differentially. Differential sensing can be used to reject stray fields around the current sensor and thus increase an accuracy of the output of the current sensor.

For example, for applications in which the current to sense is small, stray fields around the current sensor can have a large impact on the accuracy of the output signal of the current sensor. Thus, by performing differential sensing, the stray fields can be reduced or eliminated to increase an accuracy of the output signal of the current sensor.

In some embodiments, using one or more Hall effect elements as the magnetic field sensing element, the conductive layer may include a single trace or coil with a Hall effect element on each side of the trace or coil. In embodiments using one or more magnetoresistance elements (e.g., giant magnetoresistance (GMR) element), a generally "U" shaped conductor can be formed on the conductive layer such that one magnetoresistance element is disposed under one side of the "U" shaped conductor and another magnetoresistance element is disposed under the other side of the "U" shaped conductor.

In a first aspect, the present disclosure is directed towards a current sensor having a primary conductor configured to carry a first portion of a primary current and a semiconductor substrate having a first surface and a second opposing surface. The first surface supports a magnetic field sensing circuit. The current sensor further includes a first insulation layer disposed over the first surface, a conductive layer disposed over the first insulation layer and at least two interconnects coupled between the primary conductor and the conductive layer. The primary conductor can be spaced from the semiconductor substrate such that the primary conductor and the semiconductor substrate do not vertically overlap each other. A second portion of the primary current can flow through the conductive layer. The magnetic field sensing circuit is configured to sense the second portion of primary current.

The conductive layer may include one or both of a coil or a trace. In some embodiments, a level of the second portion of the primary current can be established in part based on a resistance value of the at least two interconnects. The at least two interconnects may include wire bonds. The semiconductor substrate may be supported by a lead frame or printed circuit board in a die up configuration.

In some embodiments, the current sensor may include a calibration circuit configured to calibrate a sensitivity of the magnetic field sensing circuit in response to a difference between a measured level of the second portion of the primary current and a predetermined level of the second portion of the primary current.

A shield layer may be disposed between the first surface of the semiconductor substrate and the first insulation layer or between the first insulation layer and the conductive layer. In some embodiments, the shield layer can be coupled to a reference potential of the magnetic sensing circuit. The shield layer comprises one or more slits, slots and/or apertures. The shield layer may include at least one of copper or aluminum.

In some embodiments, the current sensor includes a second insulation layer disposed over the conductive layer. The first and second insulation layers can include at least one of a polyimide film, silicon dioxide or a layer of adhesive. The first and second insulation layers can have a thickness ranging from about 5 µm to about 50 µm.

The conductive layer may include at least one of a metalized tape or a metalized Mylar®. In some embodiments, the primary conductor, the conductive layer, and the at least two interconnects may include the same material.

The magnetic field sensing circuit may include a magnetic field sensing element comprising at least one of a Hall effect element or a magnetoresistance element. For example, the magnetoresistance element may include at least one of Indium Antimonide (InSb), a giant magnetoresistance (GMR) element, an anisotropic magnetoresistance (AMR) element, a tunneling magnetoresistance (TMR) element or a magnetic tunnel junction (MTJ) element.

The magnetic field sensing circuit can be configured to sense a magnetic field in a first and second direction, and a difference between a strength of the magnetic field in the first and second direction can be proportional to the second portion of the primary current. An output voltage of the current sensor may be proportional to the primary current.

In another aspect, a current sensor is provided having a lead frame. The lead frame comprises at least two leads coupled together to form a primary conductor to carry a primary current and a signal lead spaced from the at least two leads to carry an output signal of the current sensor having a level indicative of a level of the primary current. A first portion of the primary current is carried by the primary conductor and a second portion is diverted from the primary conductor. The current sensor further includes a semiconductor substrate having a first surface distal from the lead frame and supporting a magnetic field sensing circuit and a second, opposing surface proximal to the lead frame. The current sensor further includes a conductive material electrically isolated from the magnetic field sensing circuit and at least two interconnects coupled between the primary conductor and the conductive material. The second portion of the primary current can flow through the conductive material and the magnetic field sensing circuit comprises one or more magnetic field sensing elements to sense the second portion of the primary current.

The magnetic field sensing circuit further comprises a calibration circuit configured to calibrate a sensitivity of the magnetic field sensing circuit in response to a difference between a measured level of the current sensor output signal for a selected primary current level and a predetermined level of the current sensor output signal for the selected primary current level.

The conductive material comprises one or both of a coil or a trace. A level of the second portion of the primary current can be established in part based on a resistance value of the at least two interconnects. The at least two interconnects may include wire bonds. In some embodiments, the primary conductor and the at least two interconnects may include the same material. The primary conductor can be spaced from the semiconductor substrate such that the primary conductor and the semiconductor substrate do not vertically overlap each other.

The one or more magnetic field sensing elements may include at least one of a Hall effect element or a magnetoresistance element. The magnetoresistance element may include at least one of Indium Antimonide (InSb), a giant magnetoresistance (GMR) element, an anisotropic magnetoresistance (AMR) element, a tunneling magnetoresistance (TMR) element or a magnetic tunnel junction (MTJ) element.

The magnetic field sensing circuit is configured to sense a magnetic field in a first and second direction, and a difference between a strength of the magnetic field in the first and second direction can be proportional to the second portion of the primary current. An output voltage of the current sensor can be proportional to the primary current.

BRIEF DESCRIPTION OF THE DRAWINGS

The foregoing features may be more fully understood from the following description of the drawings in which:

FIG. 3 is a cross section of a current sensor having a primary conductor coupled to a conductive layer disposed on a semiconductor substrate;

FIG. 3A is a cross section of a current sensor of FIG. 3 having a shield layer disposed between the semiconductor substrate and first insulation layer;

DETAILED DESCRIPTION

Before describing the present invention, some introductory concepts and terminology are explained.

As used herein, the term "magnetic field sensing element" is used to describe a variety of electronic elements that can sense a magnetic field. The magnetic field sensing element can be, but is not limited to, a Hall-effect element, a magnetoresistance element, or a magnetotransistor. As is known, there are different types of Hall-effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensing circuit" is used to describe a circuit that uses a magnetic field sensing element, generally in combination with other circuits. Magnetic field sensing circuits are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

Figure 1:
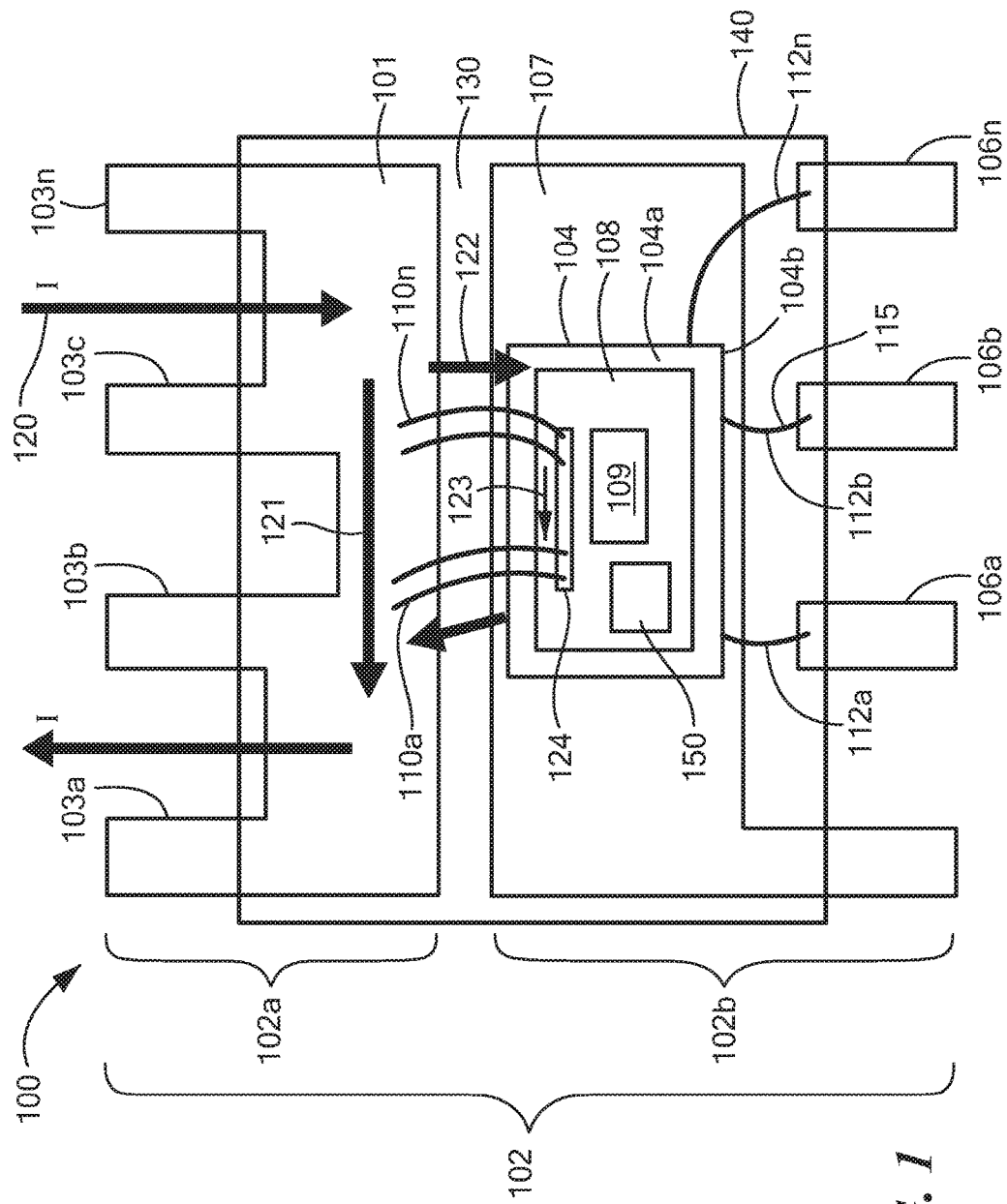
FIG. 1 is a top view of a current sensor having a primary conductor coupled to a conductive layer disposed on a semiconductor substrate.

Now referring to FIG. 1, a current sensor 100 is provided whereby a current to be sensed is split between a primary current path and a secondary current path. More particularly, a portion of the primary current is diverted to the secondary current path such that the portion provided to the secondary current path is sensed by a magnetic field sensing circuit 150 of current sensor 100.

Current sensor 100 includes a current conductor 101 and a semiconductor substrate 104. Current conductor 101 receives a primary current 120.

Semiconductor substrate 104 includes a first surface 104a and a second opposing surface 104b. First surface 104a supports a magnetic field sensing circuit 108. An insulation layer (e.g., insulation layer 320 of FIG. 3) may be disposed over the first surface 104a and magnetic field sensing circuit 108. A conductive layer 124 is disposed over the insulation layer and thus over the first surface 104a and magnetic field sensing circuit 108. The insulation layer may be provided to electrically isolate conductive layer 124 from magnetic field sensing circuit 108.

One or more interconnects 110a-110n couple current conductor 101 to conductive layer 124 such that a second portion 122 of primary current 120 flows through conductive layer 124. In an embodiment, magnetic field sensing circuit 108 can be configured to sense the second portion 122 of primary current 120.

The current sensor 100 may be provided as an integrated circuit (IC) having a lead frame 102. The lead frame 102 may have two portions, the first portion 102a for carrying primary current 120 and a second portion 102b for carrying signals to and from current sensor 100. The first portion 102a of the lead frame may provide current conductor 101 that includes leads 103a-103n and the second portion 102b of the lead frame may comprise the plurality of signal leads (or pins) 106a-106n. The second lead frame portion 102b may include a die attach pad, area, or paddle 107 supporting the substrate 104 and signal leads 106a-106n coupled to magnetic field sensing circuit 108 through interconnects 112a-112n for carrying signals to and from magnetic field sensing circuit 108. In some embodiments, interconnects 112a-112n may include wire bonds coupled between a bond pad disposed on a surface (e.g., active surface) of substrate 104 and at least one of signal leads 106a-106n.

Figure 2:
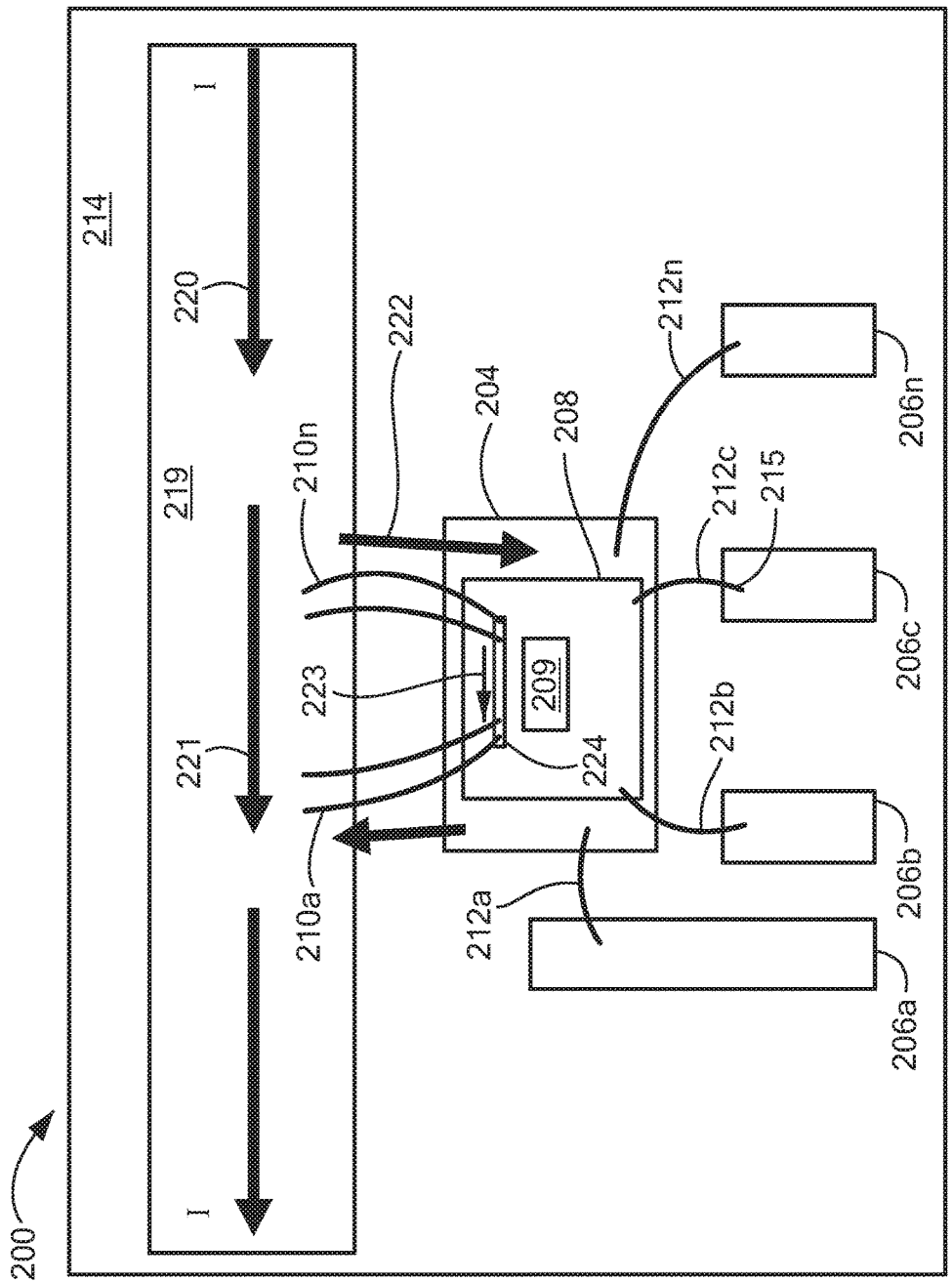
FIG. 2 is a top view of an alternative current sensor having a primary conductor coupled to a conductive layer disposed on a semiconductor substrate.

Magnetic field sensing circuit 108 may include at least one magnetic field sensing element 109. In some embodiments, magnetic field sensing circuit 108 may include multiple magnetic field sensing elements 109. Magnetic field sensing element 109 may include a Hall effect element and/or a magnetoresistance element. The magnetoresistance element may include at least one of an Indium Antimonide (InSb), a giant magnetoresistance (GMR) element, an anisotropic magnetoresistance (AMR) element, a tunneling magnetoresistance (TMR) element or a magnetic tunnel junction (MTJ) element. Although the sensing element(s) 109 is shown positioned to the side of the conductive trace 124, it will be appreciated that the sensing elements may be disposed underneath the conductive trace (or more specifically underneath the isolation layer, but vertically aligned, or overlapping with the conductive trace), depending on the type of sensing elements used and its axis of maximum sensitivity. For example, vertical Hall and MR elements may vertically align or overlap the conductive trace; whereas, a planar Hall may be positioned to the side of the conductive trace as shown in FIGS. 1 and 2.

Conductive layer 124 can be disposed in a layer (or multiple layers) above magnetic field sensing circuit 108 and magnetic field sensing element 109. For example, conductive layer 124 may be disposed in a redistribution layer. The redistribution layer may be disposed above (or otherwise over) an insulation layer that is disposed above (or otherwise over) the magnetic field sensing circuit 108 such that conductive layer 124 is effectively isolated from magnetic field sensing circuit 108.

Conductive layer 124 may include various types of conductive material. For example, conductive layer 124 may include at least one of metalized tape or Mylar®. In some embodiments, conductive layer 124 may include a coil or a trace formed on or otherwise disposed on a surface of the substrate 104.

Conductive layer 124 is coupled to primary current path 121 through one or more interconnects 110a-110n such that a first portion of the primary current 120 flows through the primary current path 121 and a second portion 122 of the primary current is diverted to flow through a secondary current path 123 including conductive layer 124. Thus, the primary current 120 may be portioned (or partitioned) between the primary current path 121 and secondary current path 123. Interconnects 110a-110n may include wire bonds.

In some embodiments, interconnects 110a-110n, 112a-112n, primary conductor 101 and conductive layer 124 may be comprised of, or include the same material. For example, the primary current path 121, secondary current path 123 and interconnects 110a-110n may include the same material such that the resistance of each of the primary current path 121, secondary current path 123 and interconnects 110a-110n is affected in the same way and at the same rate over temperature. Thus, the primary current path 121, secondary current path 123, conductive layer 124, and interconnects 110a-110n, 112a-112n may include at least one of wire bonds and/or be comprised of one or more of copper, aluminum, or gold. In other embodiments, one or more of interconnects 110a-110n, 112a-112n, primary conductor 101 and conductive layer 124 may include different materials.

In some embodiments, the amount of current diverted from the conductor 101 to flow through the secondary current path 123 corresponds to a resistance value of interconnects 110a-110n. For example, properties (e.g., material, thickness, length, total number) of interconnects 110a-110n can be modified to change the amount of current provided to secondary current path 123. Thus, in some embodiments, the amount of current partitioned between the primary current path 121 and secondary current path 123 can be controlled by modifying the resistance value of interconnects 110a-110n.

The amount of current partitioned between the primary current path 121 and secondary current path 123 can correspond to a ratio of impedances of both the primary current path 121 and secondary current path 123. An inductance value and resistance value of each of the primary current path 121 and secondary current path 123 can be selected such that the ratio of the inductance value and resistance value between each path stays within an impedance ratio threshold. For example, if the inductance values between each path do not have the same ratio as the resistance value across each path, the current splitting can vary over frequency. In an embodiment, the primary current path 121 and secondary current path 123 can be designed such that the inductance value of each path has the same or substantially similar ratio as the resistance values of each path. Thus, the resistance and/or inductance values across primary current path 121 and secondary current path 123 can be proportional such that a ratio of impedances of both currents paths is the same or substantially similar across a frequency range being measured.

Semiconductor substrate 104 may be spaced a predetermined distance 130 from current conductor 101. The distance may be selected based at least in part on a particular application of current sensor 100 and/or dimensions of current sensor 100. The primary conductor 101 can be spaced from the semiconductor substrate 104 such that the primary conductor and the semiconductor substrate do not vertically overlap each other.

In some embodiments, current conductor 101 may be provided in the same package 140 as semiconductor substrate 104 and magnetic field sensing circuit 108 as shown in FIG. 1. For example, the full primary current 120 can be provided to current conductor 101 and thus to package 140. The current can then be split or otherwise portioned between current conductor 101 and conductive layer 124 within current sensor package 140.

In some embodiments, the semiconductor substrate and magnetic field sensing circuit may be disposed or otherwise mounted on a printed circuit board (PCB), which PCB can be coupled by wire bonds or other interconnects to a primary conductor (FIG. 2).

Magnetic field sensing circuit 108 may include a calibration circuit 150. Calibration circuit 150 can be configured to calibrate a sensitivity of the magnetic field sensing circuit 108. For example, in response to a difference between a measured level of a current sensor output signal for a selected primary current level and a predetermined level of the current sensor output signal for the selected primary current level, calibration circuit 150 can calibrate a sensitivity of the magnetic field sensing circuit 108.

Magnetic field sensing element 109 may experience a change in sensitivity, for example and without limitations, due to temperature changes in an environment around and/or within current sensor 100. The change in sensitivity can impact the performance of magnetic field sensing element 109 and thus impact the accuracy of output signal 115 of current sensor 100. Calibration circuit 150 can be configured to detect a change in sensitivity of magnetic field sensing element 109 by comparing an expected output of current sensor 100 to a measured output of current sensor 100. Calibration circuit 150 can generate a compensation signal to modify and/or tune the output signal 115 to account for the change in sensitivity.

Now referring to FIG. 2, a current sensor 200 is provided having a current conductor 219 and a magnetic field sensing circuit 208. Current sensor 200 may be similar to current sensor 100 of FIG. 1, however here, the current conductor 219 and a semiconductor substrate 204 supporting the magnetic field sensing circuit 208 are supported by a printed circuit board (PCB) 214.

A primary current 220 is provided to current conductor 219. A first portion of the primary current 220 is carried by a primary current path 221 and a second portion 222 of the primary current is diverted to a secondary current path 223 including a conductive layer 224.

A printed circuit board, or more generally support 214 supports one or more signal leads 206a-206n to carry the output signal 215 of current sensor 200 and other signals to and from the magnetic field sensing circuit 208. In this embodiment, signal leads 206a-206n may take the form of conductive traces on the printed circuit board 214. The output signal 215 may have a level indicative of (proportional to) a level of primary current 220. Signal leads 206a-206n can be coupled to magnetic field sensing circuit 208 (or another active surface of current sensor 200) through one or more interconnects 212a-212n.

Magnetic field sensing circuit 208 may include at least one magnetic field sensing element 209. In some embodiments, magnetic field sensing circuit 208 may include multiple magnetic field sensing elements 209. Magnetic field sensing element 209 may include a Hall effect element and/or a magnetoresistance element. The magnetoresistance element may include at least one of an Indium Antimonide (InSb), a giant magnetoresistance (GMR) element, an anisotropic magnetoresistance (AMR) element, a tunneling magnetoresistance (TMR) element or a magnetic tunnel junction (MTJ) element.

Magnetic field sensing element 209 may be disposed on or otherwise supported by a first surface of a semiconductor substrate 204. In some embodiments, the first surface of the substrate 204 may be distal from the PCB 214 and a second opposing surface may be proximal to the PCB 214. Such a configuration is referred to as a "die up" configuration.

Conductive layer 224 can be disposed in a layer (or multiple layers) above magnetic field sensing circuit 208 and magnetic field sensing element 209. For example, conductive layer 224 may be disposed in a redistribution layer. The redistribution layer may be disposed above (or otherwise over) an insulation layer that is disposed above (or otherwise over) the magnetic field sensing circuit 208 such that conductive layer 224 is electrically isolated from magnetic field sensing circuit 208.

Conductive layer 224 may include a coil or a trace formed on or otherwise disposed on a surface of the redistribution layer or insulation layer. In some embodiments, conductive layer 224 may include at least one of a metalized tape or Mylar®.

Conductive layer 224 is coupled to current conductor 219 through one or more interconnects 210a-210n such that a second portion 222 of the primary current 220 is diverted to flow through secondary current path 223 including conductive layer 224. For example, the second portion 222 of primary current 220 can flow through the conductive material 224 such that magnetic field sensing circuit 208 can sense the second portion 222 of primary current 220.

A level of the second portion 222 of the primary current 220 can be established at least in part based on a resistance value of interconnects 210a-210n. For example, an amount of current split between the primary current path 221 and the secondary current path 223 can correspond to (or be controlled by) the resistance value of interconnects 210a-210n. To modify (e.g., increase, decrease) the amount of current provided to either the primary current path 221 or the secondary current path 223, the resistance value of interconnects 210a-210n can be modified (e.g., increased, decreased).

Interconnects 210a-210n may include wire bonds. Thus, in some embodiments, to modify the resistance values of interconnects 210a-210n, a thickness of one or more interconnects 210a-210n may be changed and/or the number of interconnects used to couple the primary conductor 219 to the conductive layer 224 may be changed.

The properties of the current conductor 219 can be modified to modify the amount of current provided to either the primary current path 221 or the secondary current path 223. For example, a thickness, length or width of primary current path 221 can be changed to change a resistance ratio between the primary current path 221 and secondary current path 223. Properties of conductive layer 224 can be modified to modify the amount of current provided to either the primary current path 221 or the secondary current path 223. For example, a thickness, length or width of conductive layer 224 can be changed to change a resistance ratio between the primary current path 221 and secondary current path 223.

In some embodiments, current conductor 202, conductive layer 224 and interconnects 210a-210n may comprise, or include the same material. In other embodiments, current conductor 202, conductive layer 224, and interconnects 210a-210n may include different materials.

Now referring to FIG. 3, a current sensor 300 is provided with wire bonding between a primary current path and a secondary current path to partition a current to be sensed such that the portion to be sensed is reduced to a level within an appropriate range (specification) of current sensor 300. Current sensor 300 may be similar to current sensor 100 of FIG. 1 and current sensor 200 of FIG. 2, however FIG. 3 provides a side view of the different layers of current sensor 300.

Current sensor 300 includes a primary conductor 302, a substrate 304, and one or more signal leads 306. In some embodiments, primary conductor 302 and signal lead 306 may form a lead frame of current sensor 300. For example, the lead frame may include a first portion and a second portion. The lead frame may be formed such that the primary conductor 302 forms the first portion and signal leads 306 and/or die attach paddle 305 form the second portion. The lead frame may include at least two leads coupled together to form the primary conductor 302 and the signal lead 306 spaced from the at least two leads to carry an output signal of current sensor 300 in order to thereby achieve voltage isolation between the primary conductor and the signals out of the sensor. In other embodiments, the current conductor 302 and signal leads 306 may be provided by conductive traces on a PCB (e.g., as shown in FIG. 2). The output signal may be at a level indicative of, or otherwise proportional to the primary current.

Substrate 304 includes a first surface 304a and a second opposing surface 304b. An insulation layer 320 is disposed on or otherwise formed over the first surface 304a of substrate 304 and a conductive layer 330 is disposed on or otherwise formed over the insulation layer 320.

Current sensor 300 further includes a magnetic field sensing circuit 308 disposed on or otherwise supported by first surface 304a of substrate 304. Magnetic field sensing circuit 308 may be disposed such that it is between the first surface 304a of substrate 304 and insulation layer 320. In some embodiments, insulation layer 320 may electrically isolate magnetic field sensing circuit 308 and circuitry (e.g., magnetic field sensing element) from other layers of current sensor 300.

Magnetic field sensing circuit 308 may include one or more magnetic sensing elements 309. Magnetic field sensing element 309 may include a Hall effect element or a magnetoresistance element. The magnetoresistance element may include at least one of an Indium Antimonide (InSb), a giant magnetoresistance (GMR) element, an anisotropic magnetoresistance (AMR) element, a tunneling magnetoresistance (TMR) element or a magnetic tunnel junction (MTJ) element.

Magnetic field sensing element 309 may be disposed on or otherwise supported by a first surface of a semiconductor substrate (e.g., as shown in FIGS. 1 and 3). In some embodiments, the first surface may be distal from the lead frame forming current conductor 302 and a second opposing surface may be proximal to the lead frame forming current conductor 302. Such a configuration is referred to as a "die up" configuration.

Conductive layer 330 can be disposed in a layer (or multiple layers) above magnetic field sensing circuit 308 and magnetic field sensing element 309. For example, conductive layer 330 may be disposed in a redistribution layer. The redistribution layer may be disposed above (or otherwise over) insulation layer 320 that is disposed above (or otherwise over) the magnetic field sensing circuit 308 such that conductive layer 330 is electrically isolated from magnetic field sensing circuit 308. Conductive layer 330 may include at least one of metalized tape or Mylar®. In some embodiments, a coil or a trace formed on or otherwise disposed on a surface of conductive layer 330.

Conductive layer 330 can be coupled to a primary conductor 302 through one or more interconnects 310. Interconnects 310 may form a secondary current path to provide a second portion of the primary current to conductive layer 330. For example, the second portion of primary current can flow through the conductive material 330 such that magnetic field sensing circuit 308 can sense the second portion of primary current. Interconnects 310 may "loop" over the edge of the substrate 304 as shown to achieve a predetermined distance and avoid breakdown between the interconnect and the edge of the substrate (as represented by the line between the substrate edge and the interconnect 310).

Signal lead 306 can be coupled to an active surface of current sensor 300 through one or more interconnects 312. For example, in some embodiments, signal lead may be coupled to magnetic field sensing circuit 308. Signals can be transmitted to and from magnetic field sensing circuit 308 to signal lead 306 through interconnects 312. In some embodiments, the signals may include an output signal of current sensor 300 that is indicative of or proportional to a level of primary current on primary conductor 302. For example, the signal may correspond to the second portion of the primary current sensed by magnetic field sensing circuit 308. In some embodiments, interconnects 312 may include a wire bond coupled between a bond pad disposed on a surface (e.g., active surface) of current sensor 300 and signal lead 306.

In some embodiments, a second insulation layer 340 may be disposed over or otherwise applied to conductive layer 330. The second insulation layer 340 may be used to provide for further isolation between the conductive layer 330 and the magnetic field sensing circuit 308. For example, the second insulation layer 340 may be added based at least in part on a distance of the magnetic field sensing circuit 308 from conductive layer 330, a desired internal creepage level, or a dielectric breakdown voltage. In some embodiments, the conductive layer 330 is patterned so that it does not extend all the way to the edges of the substrate 304 in order to maintain isolation and prevent a path for breakdown along the edge of the die. For example, in some embodiments (particularly those not including insulation layer 340), the conductive layer 330 may terminate between approximately 0.2 mm and 0.4 mm from the die edges or through the package plastic to signal level wire bonds 312. In other embodiments, such as those embodiments including insulation layer 340, the conductive layer may terminate closer to the die edges, such as on the order of between 10 µm and 50 µm for example. The second insulation layer 340 encloses the edges of the conductive layer 330, as shown.

In some embodiments, one or more vias may be formed in second insulation layer 340 to allow a coupling between conductive layer 330 and interconnects 310. For example, the one or more vias may be formed such that a surface of conductive layer 330 can be coupled to interconnect 310 and thus to primary conductor 302 to receive the second portion of the primary current.

Each of first and second insulation layers 320, 340 can be formed having a range of different thicknesses for different application of current sensor 300. The thickness of first and/or second insulation layers 320, 340 can be selected such that conductive layer 330 is electrically isolated from magnetic field sensing circuit 308. For example, the thickness of first and/or second insulation layers 320, 340 can be selected based at least in part on a desired distance of conductive layer 330 from magnetic field sensing circuit 308, a thickness of conductive layer 330, magnetic field sensing circuit 308 or both. In some embodiments, first and/or second insulation layers 320, 340 can have a thickness ranging from about 5 µm to about 50 µm.

First and second insulation layers 320, 340 may include at least one of a polyimide film, silicon dioxide, a layer of adhesive or a voltage isolation material.

In some embodiments, a shield layer 360 may be disposed on or otherwise formed over the first surface 304a of substrate 304. For example, and now referring to FIG. 3A, shield layer 360 may be formed such that it is disposed between the first substrate surface 304a and the first insulation layer 320.

The shield layer 360 can be disposed in various arrangements between the magnetic field sensing circuit 308 and the conductor layer 330 to shunt transient voltage noise to ground through the shield layer 360. In some embodiments, the shield layer 360 may be disposed along at least one surface of the substrate 304 supporting the magnetic field sensing circuit 308 to shield the magnetic field sensing element and associated circuitry from external noise and internal noise, such as may be capacitively coupled from the current carrying conductive layer 330 in current sensor 300. The shield layer 360 may be disposed in various arrangements to reduce the effect of parasitic coupling between the magnetic field sensing element 308 and the current carrying conductive layer 330.

The shield layer 360 may be coupled to a reference potential (e.g., ground, VCC). In some embodiments, the shield layer 360 may include one or more slits, slots or apertures. The shield layer may include at least one of copper or aluminum.

The shield layer 360 may be on the order of 0.5 to 4 µm, and the conductive layer 330 may be on the order of 0.5 to 10 µm. However, it will be appreciated that other thicknesses are possible. For example, if a suitable process is available, thicker layers may be used.

Figure 4:
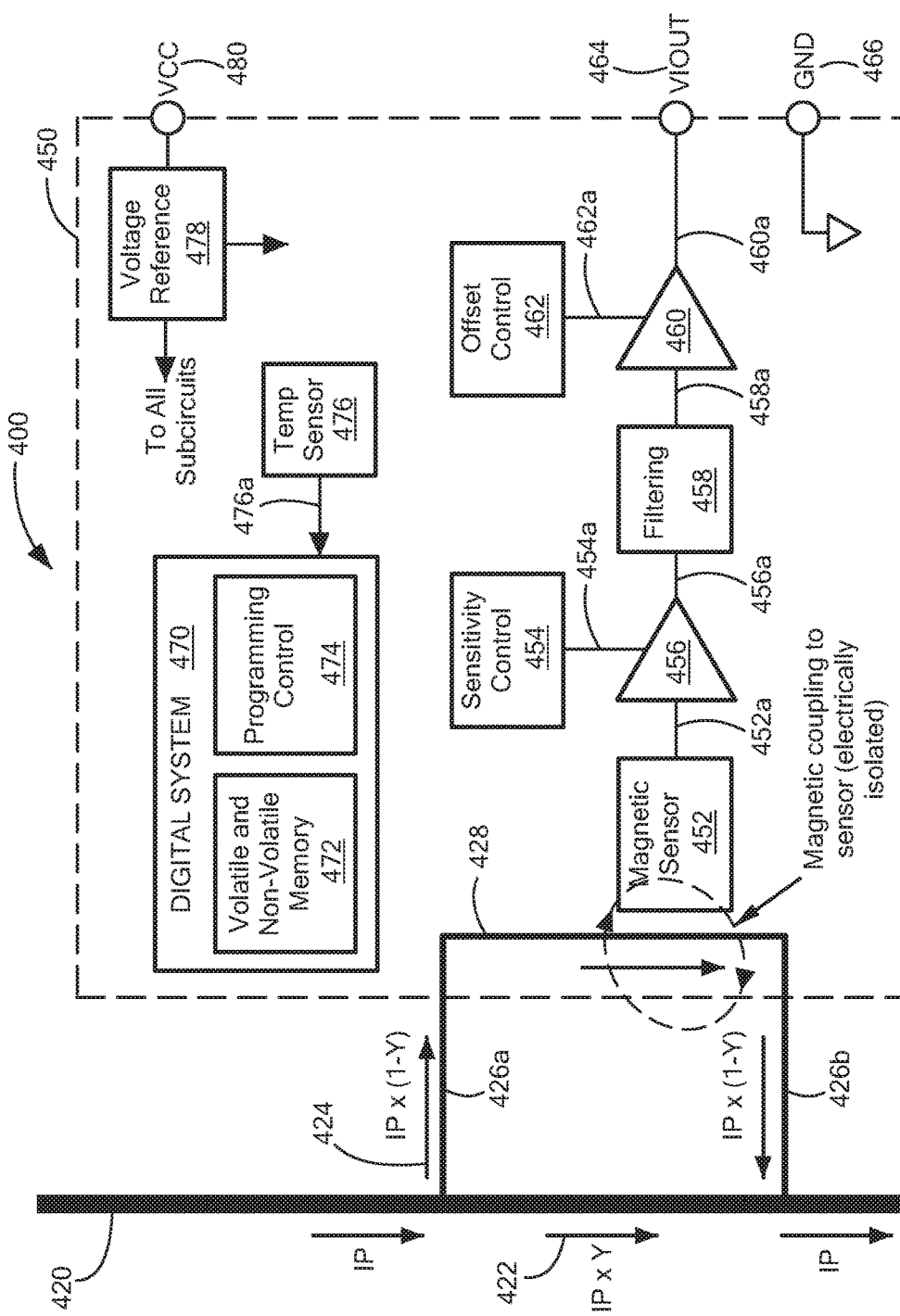
FIG. 4 is a circuit diagram of a current sensor having a magnetic field sensing element disposed in relation to a conductive layer carrying a portion of a primary current.

Now referring to FIG. 4, a current sensor 400 includes a magnetic field sensing circuit 450. Primary conductor 420 carries a primary current. The primary current 420 includes a first portion 422 and a second portion 424. Interconnects 426a, 426b provide the second portion 424 of the primary current 420 to a conductive layer 428 in proximity to the magnetic field sensing circuit 450.

Conductive layer 428 is formed such that it is disposed a predetermined distance from a magnetic field sensing element 452 within magnetic field sensing circuit 450. In some embodiments, conductive layer 428 may be magnetically coupled to magnetic field sensing element 452 (electrically isolated). Magnetic field sensing element 452 is configured to sense the second portion 424 of the primary current. For example, magnetic field sensing element 452 may be positioned such that is can sense the second portion 424 as it flows through the conductive layer 428 and generate a magnetic field signal 452a corresponding to the second portion 424.

Magnetic sensing element 452 may include a Hall effect element and/or a magnetoresistance element. For example, the magnetoresistance element may include at least one of at least one of Indium Antimonide (InSb), a giant magnetoresistance (GMR) element, an anisotropic magnetoresistance (AMR) element, a tunneling magnetoresistance (TMR) element or a magnetic tunnel junction (MTJ) element.

A magnetic field signal 452a provided by the magnetic sensing element 452 is coupled to a first input of a first amplifier 456. A second input of first amplifier 456 may be coupled to an output of a sensitivity control circuit 454 configured to generate a compensation for a change in sensitivity experienced by magnetic field sensing element 452. Thus, in some embodiments, sensitivity signal 454a may include a compensation for the change in sensitivity of magnetic field sensing element 452 or a change in the ratio of the current splitting. First amplifier 456 can change a gain of the magnetic field signal 452a depending upon a value of the sensitivity signal 456a.

An output of first amplifier 456 is coupled to an input of a filter 458. Filter 458 isolates the bandwidth of the current to be sensed and may include low-pass filtering. If the current being sensed is AC, filter 458 may include a band-pass filter.

Filter 458 can be configured to receive the signal 456a and generate a filtered signal 458a. An output of filter 458 is coupled to second amplifier 460.

An output of an offset control circuit 462 can be coupled to the second amplifier 460 to provide an offset control signal 462a. The offset control signal 462a may include an offset value to reduce an offset (e.g., DC offset) of the filtered signal 458a. In some embodiments, the offset value may be based at least in part on the characteristics of magnetic field sensing element 542.

Second amplifier 460 can be configured to receive the filtered signal 458a and apply offset control signal 462a to the filtered signal 458a to generate a second control signal 460a. In an embodiment, an output of second amplifier 460 can be coupled to a $VI_{out}$ node of magnetic field sensing circuit 450. Thus, second control signal 460a may be the output of magnetic field sensing circuit 450.

Magnetic field sensing circuit 450 may include digital control circuits 470. Digital control circuits 470 include a memory circuit 472 and a processor circuit 474. Memory circuit 472 may include volatile and non-volatile memory. The non-volatile memory may store computer instructions, an operating system and/or data. Non-volatile memory may include one or more look-up tables for storing and organizing captured data, as well as any tables or matrices generated using the captured data. In one example, the computer instructions can be executed by the processor circuit 474 out of volatile memory. In some embodiments, sensitivity control circuit 454 and offset control circuit 462 can be components of digital control circuits 470.

In some embodiments, magnetic field sensing circuit 450 includes a temperature sensor 476. Temperature sensor 476 can be configured to detect a temperature in an environment around and/or within current sensor 400 and/or magnetic field sensing circuit 450. In some embodiments, temperature sensor 476 can detect a change in a temperature in the environment around and/or within current sensor 400 and/or magnetic field sensing circuit 450. For example, a change in a sensitivity of magnetic field sensing element 452 may be caused by from temperature changes. Thus, temperature sensor 476 can provide temperature information to digital control circuits 470.

An output of temperature sensor 450 is coupled to an input of digital control circuits 470 to provide a temperature signal 476a to digital control circuits 470. In some embodiments, the temperature information from temperature signal 476a may be used to generate the sensitivity signal 454a. For example, digital control circuits 470 may use temperature signal 476a to instruct sensitivity control circuit 454 on an amount to compensate the magnetic field signal 452a generated by magnetic field sensing element 452.

Magnetic field sensing circuit 450 may include a first and second reference voltage node 480, 466 and an output node 464. The first reference voltage node 480 (e.g., VCC) may be coupled to a voltage source. The voltage source may provide a voltage to magnetic field sensing circuit 450 and thus each of the components of magnetic field sensing circuit 450. The second reference voltage 466 may be coupled to ground. The output node 464 may correspond to an output of magnetic field sensing circuit 450.

Figure 5:
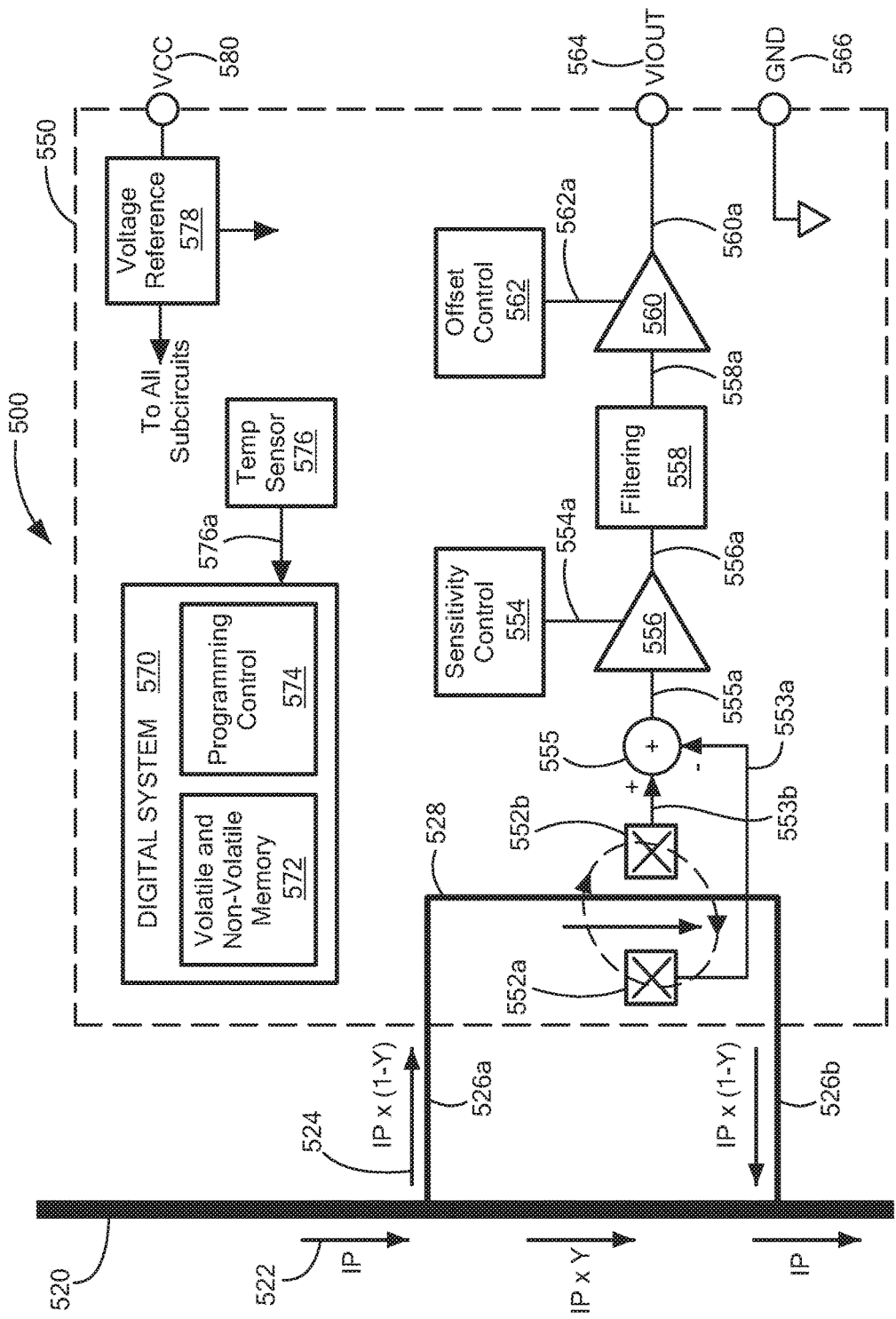
FIG. 5 is a circuit diagram of a current sensor having Hall effect elements disposed in relation to a conductive layer carrying a portion of a primary current.

In some embodiments, magnetic sensing element 452 may be provided as one or more Hall effect elements. For example, and now referring to FIG. 5, a current sensor 500 is provided having a magnetic sensing circuit 550 coupled to a primary conductor 520 through at least two interconnects 526a, 526b. Primary conductor 520 carries a first portion 522 of a primary current. Interconnects 526a, 526b provide a second portion 524 of the primary current to a conductive layer 528 of magnetic field sensing circuit 550.

Current sensor 500 can be similar to current sensor 400 of FIG. 0.4, however a magnetic field sensing element within magnetic field sensing circuit is provided as two Hall effect elements 552a, 552b. Hall effect elements 552a, 552b can be configured to sense the second portion 524 of the primary current. For example, Hall effect elements 552a, 552b may be positioned such that first Hall effect element 552a senses a magnetic field corresponding to the second portion 524 in a first direction and second Hall effect element 552b senses a magnetic field corresponding to the second portion 524 in a second direction. First Hall effect 552a may generate a first magnetic field signal 452a corresponding to the first direction and second Hall effect element 552b may generate a second magnetic field signal 553b corresponding the second direction.

An output of first Hall effect element 552a may be coupled to a first input of a combiner 555 to provide the first magnetic field signal 553a to combiner 555 and an output of second Hall effect element 552b may be coupled to a second input of a combiner 555 to provide the second magnetic field signal 553b. Combiner 555 can be configured to generate a differential field signal 55a. The differential field signal 555a may correspond to a difference between the magnetic field sensing in the first direction and the magnetic field sensed in the second direction by first and second Hall effect elements 552a, 552b.

Thus, magnetic field sensing circuit 550 may be similar to magnetic field sensing circuit 450 of FIG. 4, however, magnetic field sensing circuit 550 includes combiner 555 to combine (e.g., compare) the outputs from each of first and second Hall effect elements 552a, 552b.

For example, an output of combiner 555 is coupled to a first input of a first amplifier 556 to provide the differential field signal 555a to first amplifier 556. A second input of first amplifier 556 is coupled to an output of a sensitivity control circuit 554. Sensitivity control circuit 554 can be configured to generate a compensation for a change in sensitivity experienced by first and second Hall effect elements 552a, 552b.

First amplifier 556 can be configured to receive the differential field signal 55a and sensitivity signal 554a and generate a first control signal 556a. First amplifier 556 can change a gain of the differential field signal 452a depending upon a value of the sensitivity signal 556a.

An output of first amplifier 556 is coupled to an input of a filter 558. Filter 558 can be configured to receive the first control signal 556a and generate a filtered signal 558a. An output of filter 558 is coupled to a first input of a second amplifier 560.

An output of an offset control circuit 562 can be coupled to a second input of second amplifier 560 to provide an offset control signal 562a. The offset control signal 562a may include an offset value to reduce an offset (e.g., DC offset) of the filtered signal 558a. In some embodiments, the offset value may be based at least in part on the characteristics of first and second Hall effect elements 552a, 552b.

Second amplifier 560 can be configured to receive the filtered signal 558a and apply offset control signal 562a to the filtered signal 558a to generate a second control signal 560a. In an embodiment, an output of second amplifier 560 can be coupled to a $VI_{out}$ node of magnetic field sensing circuit 550. Thus, second control signal 560a may be the output of magnetic field sensing circuit 550.

Magnetic field sensing circuit 550 may include digital control circuits 570. Digital control circuits 570 include a memory circuit 572 and a processor circuit 574. Memory circuit 572 may include volatile and non-volatile memory. The non-volatile memory may store computer instructions, an operating system and/or data. Non-volatile memory may include one or more look-up tables for storing and organizing captured data, as well as any tables or matrices generated using the captured data. In one example, the computer instructions can be executed by the processor circuit 574 out of volatile memory. In some embodiments, sensitivity control circuit 554 and offset control circuit 562 can be components of digital control circuits 570.

In some embodiments, magnetic field sensing circuit 550 includes a temperature sensor 576. Temperature sensor 576 can be configured to detect a temperature in an environment around and/or within current sensor 500 and/or magnetic field sensing circuit 550. In some embodiments, temperature sensor 576 can detect a change in a temperature in the environment around and/or within current sensor 500 and/or magnetic field sensing circuit 550. For example, a change in a sensitivity of magnetic field sensing element 552 may be caused by from temperature changes. Thus, temperature sensor 576 can provide temperature information to digital control circuits 570.

An output of temperature sensor 550 is coupled to an input of digital control circuits 570 to provide a temperature signal 576a to digital control circuits 570. In some embodiments, the temperature information from temperature signal 576a may be used to generate the sensitivity signal 554a. For example, digital control circuits 570 may use temperature signal 576a to instruct sensitivity control circuit 554 on an amount to compensate the differential field signals 553a, 553b generated by first and second Hall effect elements 552a, 552b.

Magnetic field sensing circuit 550 may include a first and second reference voltage node 580, 566 and an output node 564. The first reference voltage node 580 (e.g., VCC) may be coupled to a voltage source. The voltage source may provide a voltage to magnetic field sensing circuit 550 and thus each of the components of magnetic field sensing circuit 550. The second reference voltage 566 may be coupled to ground. The output node 564 may correspond to an output of magnetic field sensing circuit 550 and thus current sensor 500.

In some embodiments, a magnetic sensing element may be provided as a magnetoresistance element. For example, and now referring to FIG. 6, a current sensor 600 is provided having a magnetic sensing circuit 650 coupled to a primary conductor 620 through at least two interconnects 626a, 626b. Primary conductor 620 carries a first portion 622 of a primary current. Interconnects 626a, 626b provide a second portion 624 of the primary current to a conductive layer 628 of magnetic field sensing circuit 650.

Current sensor 500 can be similar to current sensor 400 of FIG. 4, however a magnetic field sensing element within magnetic field sensing circuit is provided as a magnetoresistance element 652. Magnetoresistance element 652 includes a first resistive element 652a, a second resistive element 652b, a third resistive element 652c and a fourth resistive element 652d. Magnetoresistance element 652 can be configured to sense the second portion 624 of the primary current. For example, magnetoresistance element 652 may be positioned such that at least two resistive elements sense a magnetic field corresponding to the second portion 624 in a first direction and at least two resistive different elements sense a magnetic field corresponding to the second portion 624 in a second direction. A difference between the magnetic field sensed in the first direction and the magnetic field sensed in the second direction may result in a differential field signal that rejects any stray fields around current sensor 600.

Figure 6:
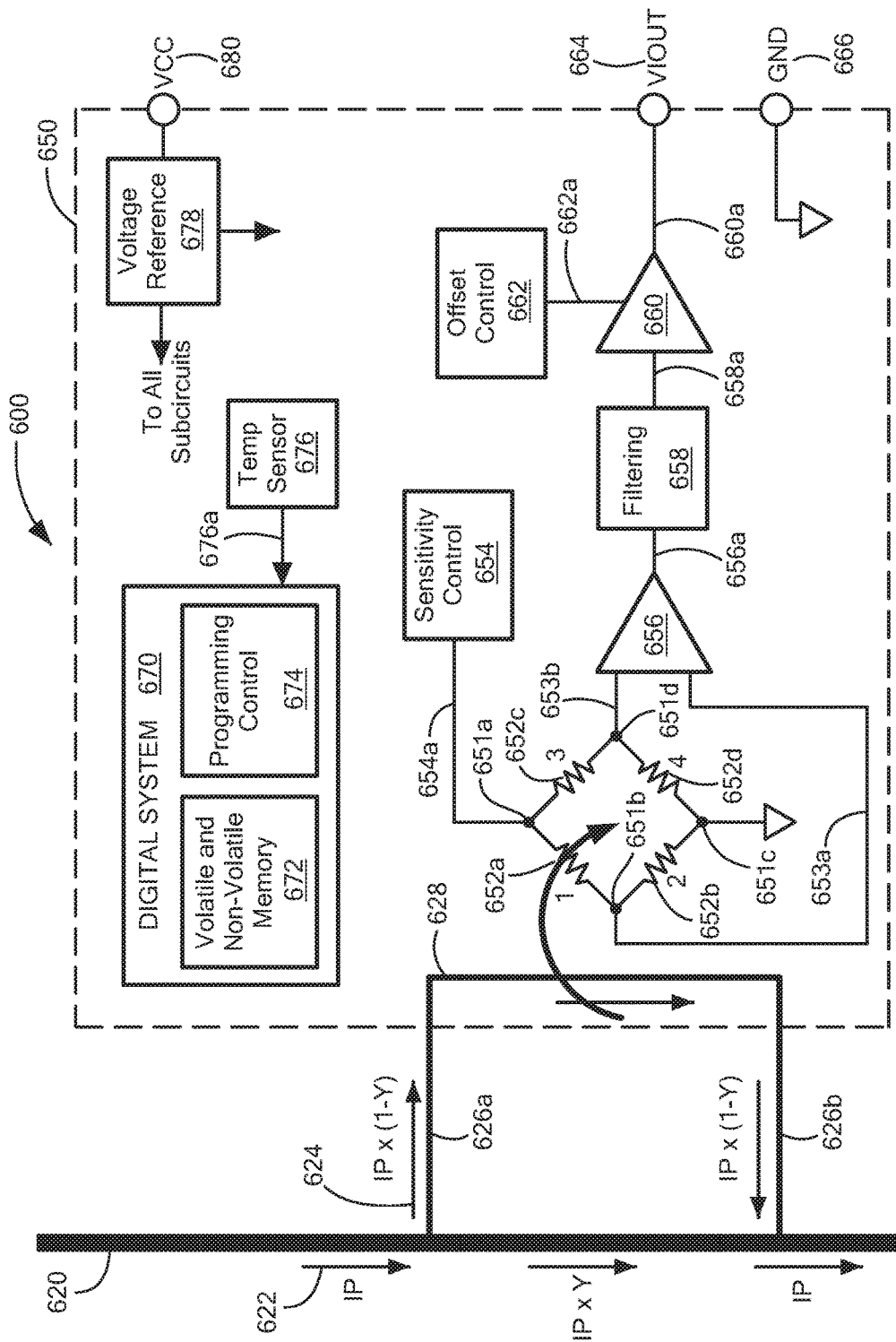
FIG. 6 is a circuit diagram of a current sensor having magnetoresistance elements disposed in relation to a conductive layer carrying a portion of a primary current.

For example, magnetoresistance element 652 may be a single element or, alternatively, may include two or more magnetic field sensing elements arranged in various configurations, e.g., a half bridge or full (Wheatstone) bridge. For example, and as illustrated in FIG. 6, magnetoresistance element 652 is provided in a full Wheatstone configuration having a first resistive element 652a, a second resistive element 652b, a third resistive element 652c and a fourth resistive element 652d and four terminals 651a, 651b, 651c, 651d. Magnetoresistance element 652 can generate differential field signals 653a, 653b at terminals 651b, 651d, respectively, that are responsive to a sensed magnetic field. For example, magnetoresistance element 652 may be positioned such that at least two resistive elements sense a magnetic field corresponding to the second portion 624 in a first direction and at least two resistive different elements sense a magnetic field corresponding to the second portion 624 in a second direction. A difference between the magnetic field sensed in the first direction and the magnetic field sensed in the second direction (i.e., difference between first differential field signal 653a and second differential field signal 653b) may result in differential field signals 653a, 653b that rejects any stray fields around current sensor 600.

Sensitivity control circuit 654 is coupled to terminal 651a to provide a sensitivity signal 654a to magnetoresistance element 652.

Terminal 651b is coupled to a first input of first amplifier 656 top provide first differential field signal 653a to first amplifier 656 and terminal 651d is coupled to a second input of first amplifier 656 top provide second differential field signal 653b to first amplifier 656. First amplifier 656 can compare the first differential signal 653a to the second differential signal 653b to generate a first control signal 656a. In an embodiment, the first control signal 656a may indicate a difference between the first differential signal 653a and the second differential signal 653b.

Thus, magnetic field sensing circuit 650 may be similar to magnetic field sensing circuit 450 of FIG. 4, however, in magnetic field sensing circuit 650, an output of sensitivity control circuit 654 is coupled to an input of magnetoresistance element 652 and magnetoresistance element 652 provides two inputs (e.g., differential signals 653a, 653b) to first amplifier 656.

For example, an output of first amplifier 656 is coupled to an input of a filter 658. Filter 658 can be configured to receive the first control signal 656a and generate a filtered signal 658a. An output of filter 658 is coupled to a first input of a second amplifier 660.

An output of an offset control circuit 662 can be coupled to a second input of second amplifier 660 to provide an offset control signal 662a. The offset control signal 662a may include an offset value to reduce an offset (e.g., DC offset) of the filtered signal 658a. In some embodiments, the offset value may be based at least in part on the characteristics of magnetoresistance element 652.

Second amplifier 660 can be configured to receive the filtered signal 658a and apply offset control signal 662a to the filtered signal 558a to generate a second control signal 660a. In an embodiment, an output of second amplifier 560 can be coupled to a $VI_{out}$ node of magnetic field sensing circuit 650. Thus, second control signal 660a may be the output of magnetic field sensing circuit 650.

Magnetic field sensing circuit 650 may include digital control circuits 670. Digital control circuits 670 include a memory circuit 672 and a processor circuit 674. Memory circuit 672 may include volatile and non-volatile memory. The non-volatile memory may store computer instructions, an operating system and/or data. Non-volatile memory may include one or more look-up tables for storing and organizing captured data, as well as any tables or matrices generated using the captured data. In one example, the computer instructions can be executed by the processor circuit 674 out of volatile memory. In some embodiments, sensitivity control circuit 654 and offset control circuit 662 can be components of digital control circuits 670.

In some embodiments, magnetic field sensing circuit 650 includes a temperature sensor 676. Temperature sensor 676 can be configured to detect a temperature in an environment around and/or within current sensor 600 and/or magnetic field sensing circuit 650. In some embodiments, temperature sensor 676 can detect a change in a temperature in the environment around and/or within current sensor 600 and/or magnetic field sensing circuit 650. For example, a change in a sensitivity of magnetic field sensing element 652 may be caused by from temperature changes. Thus, temperature sensor 676 can provide temperature information to digital control circuits 670.

An output of temperature sensor 650 is coupled to an input of digital control circuits 670 to provide a temperature signal 676a to digital control circuits 670. In some embodiments, the temperature information from temperature signal 676a may be used to generate the sensitivity signal 654a. For example, digital control circuits 670 may use temperature signal 676a to instruct sensitivity control circuit 654 on an amount to compensate the differential field signals 653a, 653b generated by magnetoresistance element 652.

Magnetic field sensing circuit 650 may include a first and second reference voltage node 680, 666 and an output node 664. The first reference voltage node 680 (e.g., VCC) may be coupled to a voltage source. The voltage source may provide a voltage to magnetic field sensing circuit 650 and thus each of the components of magnetic field sensing circuit 650. The second reference voltage 666 may be coupled to ground. The output node 664 may correspond to an output of magnetic field sensing circuit 650 and thus current sensor 600.

Figure 7A:
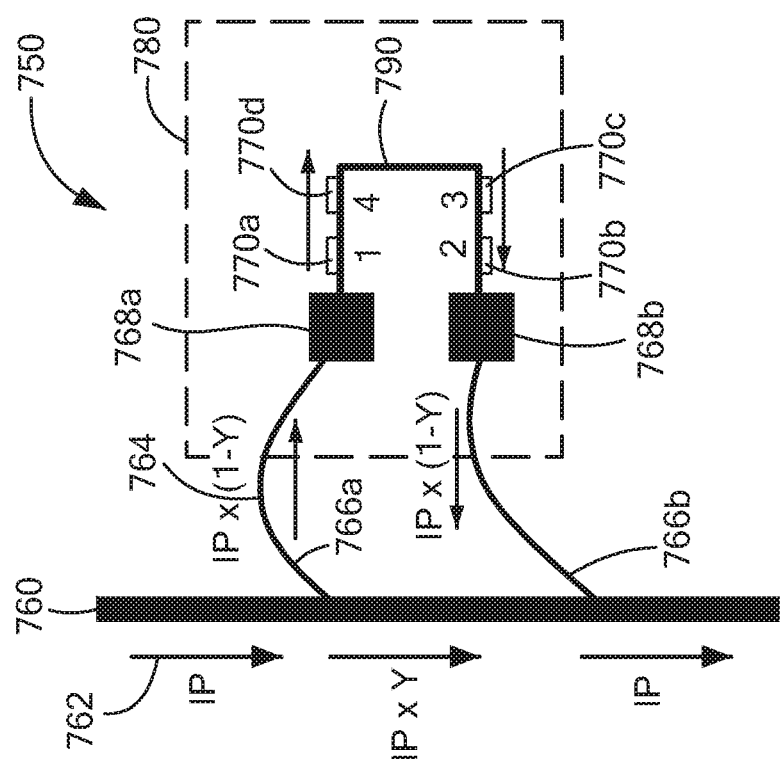
FIG. 7A is a circuit diagram illustrating different sensing for a current sensor having magnetoresistance elements.
Figure 7:
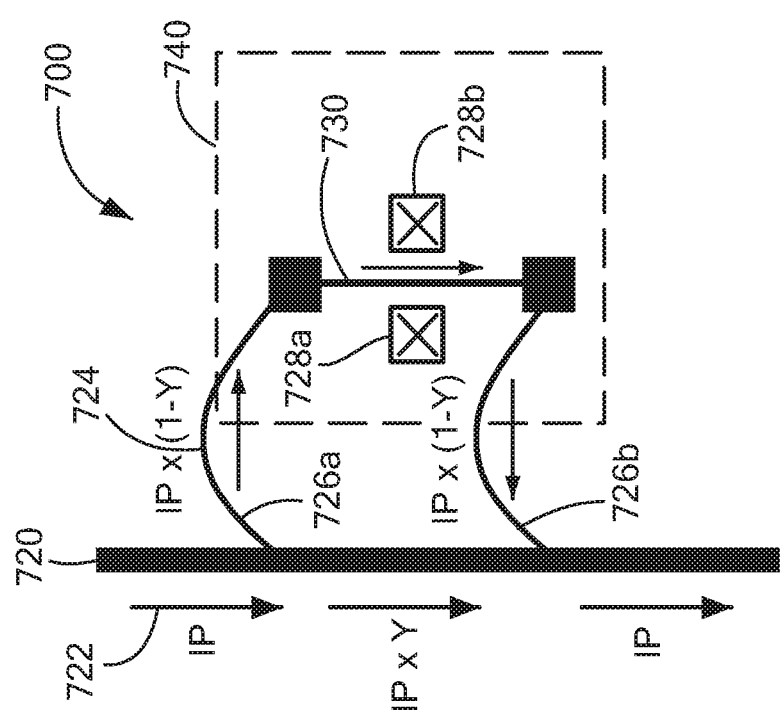
FIG. 7 is a circuit diagram illustrating differential sensing for a current sensor having Hall effect elements.

Now referring to FIGS. 7 and 7A, the currents sensors described herein can be configured to perform differential sensing. The conductive layer can be formed such that the conductive layer can generate magnetic fields in different (e.g., opposite) directions. One or more magnetic field sensing elements can be positioned within the current sensor such that the respective one or more magnetic field sensing elements can sense the magnetic fields in each of the different directions. The magnetic field sensing elements can generate an output for each direction in which the magnetic field is sensed and the magnetic field sensing circuit can include additional circuitry to combine the different outputs and perform differential sensing. Differential sensing can be used to reject stray fields around the current sensor and thus increase an accuracy of the output of the current signal.

For example, and now referring to FIG. 7, a differential sensing arrangement 700 is provided having a magnetic field sensing circuit 740 disposed a predetermined distance from primary conductor 720 carrying a primary current. Magnetic field sensing circuit 740 includes two Hall effect elements 728a, 728b and a conductive layer 730.

Magnetic field sensing circuit 740 may be positioned such that it can sense a portion of the primary current. For example, primary current carries a first portion 722 of a primary current and primary conductor 720 may be coupled to conductive layer 730 of magnetic field sensing circuit 740 through at least two interconnects 726a, 726b. In an embodiment, interconnects 726a, 726b may provide a second portion 724 of the primary current to conductive layer 730.

Hall effect elements 728a, 728b can be positioned such that they can perform differential sensing to sense a magnetic field corresponding to the second portion 724 in at least two directions. For example, in some embodiments having Hall effect elements 728a, 728b as the magnetic field sensing element, the conductive layer 730 may include a single trace or coil with at least one of Hall effect elements 728a, 728b on each side of the trace or coil. As illustrated in FIG. 7, a first Hall effect element 728a can sense the magnetic field corresponding to the second portion 724 in a first direction and a second Hall effect element 728b can sense the magnetic field corresponding to the second portion 724 in a second opposite direction. Hall effect elements 728a, 728b can generate a differential signal that represents a difference between the magnetic field in the first direction as compared to the magnetic field in the second direction. In an embodiment, the difference between a strength of the magnetic field in the first direction as compared the magnetic field in the second direction may be proportional to the second portion 724.

Now referring to FIG. 7A, a differential sensing arrangement 750 is provided having a magnetic field sensing circuit 780 disposed a predetermined distance from a primary conductor 760 carrying a primary current. In an embodiment, FIG. 7A may be similar to FIG. 7, however the magnetic sensing elements in FIG. 7A are provided in the form of magnetoresistance elements (e.g., GMR element). For example, magnetic field sensing circuit 780 includes a magnetic field sensing element 764 in the form of four magnetoresistive elements 770a, 770b, 770c, 770d, as may be coupled in a bridge configuration (e.g., FIG. 6).

Magnetic field sensing circuit 780 may be positioned such that it can sense a portion of the primary current. For example, primary current carries a first portion 762 of a primary current and primary conductor 760 may be coupled to conductive layer 790 through at least two interconnects 766a, 766b. In an embodiment, interconnects 766a, 766b may provide a second portion 764 of the primary conductor to conductive layer 790.

Magnetoresistance element 764 can be configured to sense a magnetic field corresponding to the second portion in at least two directions and generate a differential signal representing a difference in the magnetic field in the first direction as compared the magnetic field in the second opposite direction. Magnetoresistance element 764 can be positioned such that it is in a layer under conductive layer 790. For example, in embodiments having a magnetoresistance element 764, conductive layer 790 may include a trace or coil formed in a generally "U" shape on conductive layer 790. Magnetoresistance element 764 can be positioned such that one half of the magnetoresistance elements (e.g., magnetoresistance elements 770a, 770d) are disposed under one side of the "U" shaped conductor and the other half of the magnetoresistance elements (e.g., magnetoresistance elements 770b, 770c) are disposed under the other side of the "U" shaped conductor. The elements under one side of the "U" shaped conductor experience magnetic field in one direction and the elements under the other side of the "U" shaped conductor experience magnetic field in the other direction, thereby enabling differential sensing.

Having described preferred embodiments, which serve to illustrate various concepts, structures and techniques, which are the subject of this patent, it will now become apparent that other embodiments incorporating these concepts, structures and techniques may be used. Accordingly, it is submitted that the scope of the patent should not be limited to the described embodiments but rather should be limited only by the spirit and scope of the following claims.

What is claimed:

1. A current sensor comprising:
a primary conductor configured to carry a first portion of a primary current;
a semiconductor substrate having a first surface and a second opposing surface, the first surface supporting a magnetic field sensing circuit, a first insulation layer disposed over the first surface, and a conductive layer disposed over the first insulation layer, wherein the primary conductor is spaced from the semiconductor substrate such that the primary conductor and the semiconductor substrate do not vertically overlap each other; and
at least two interconnects comprising wire bonds coupled between the primary conductor and the conductive layer, wherein a second portion of the primary current flows through the conductive layer, and wherein the magnetic field sensing circuit is configured to sense the second portion of the primary current.

2. The current sensor of claim 1, wherein the conductive layer comprises one or both of a coil and a trace.

3. The current sensor of claim 1, wherein a level of the second portion of the primary current is established in part based on a resistance value of the at least two interconnects.

4. The current sensor of claim 1, further comprising a calibration circuit configured to calibrate a sensitivity of the magnetic field sensing circuit in response to a difference between a measured level of the second portion of the primary current and a predetermined level of the second portion of the primary current.

5. The current sensor of claim 1, wherein the semiconductor substrate is supported by a lead frame or a printed circuit board in a die up configuration.

6. The current sensor of claim 1, further comprising a shield layer disposed between the first surface of the semiconductor substrate and the first insulation layer or between the first insulation layer and the conductive layer.

7. The current sensor of claim 6, wherein the shield layer is coupled to a reference potential of the magnetic field sensing circuit.

8. The current sensor of claim 6, wherein the shield layer comprises one or more slits.

9. The current sensor of claim 6, wherein the shield layer comprises one or both of copper and aluminum.

10. The current sensor of claim 1, further comprising a second insulation layer disposed over the conductive layer.

11. The current sensor of claim 10, wherein the first and second insulation layers comprise one of or a combination of two or more of a polyimide film, silicon dioxide, and a layer of adhesive.

12. The current sensor of claim 10, wherein the first and second insulation layers have a thickness ranging from about 5 μm to about 50 μm.

13. The current sensor of claim 1, wherein the conductive layer comprises one or both of a metalized tape and a metalized Mylar®.

14. The current sensor of claim 1, wherein the primary conductor, the conductive layer, and the at least two interconnects comprise the same material.

15. The current sensor of claim 1, wherein the magnetic field sensing circuit comprises a magnetic field sensing element comprising one or both of a Hall effect element and a magnetoresistance element.

16. The current sensor of claim 15, wherein the magnetoresistance element comprises one of or a combination of two or more of Indium Antimonide (InSb), a giant magnetoresistance (GMR) element, an anisotropic magnetoresistance (AMR) element, a tunneling magnetoresistance (TMR) element, and a magnetic tunnel junction (MTJ) element.

17. The current sensor of claim 1, wherein the magnetic field sensing circuit is configured to sense a magnetic field in first and second directions, and wherein a difference between a strength of the magnetic field in the first and second directions is proportional to the second portion of the primary current.

18. The current sensor of claim 1, wherein an output voltage of the current sensor is proportional to the primary current.

19. A current sensor comprising:
a lead frame comprising at least two leads coupled together to form a primary conductor to carry a first portion of a primary current and a signal lead spaced from the at least two leads to carry an output signal of the current sensor having a level indicative of a level of the primary current;
a semiconductor substrate having a first surface distal from the lead frame, the first surface supporting a magnetic field sensing circuit and a conductive layer electrically isolated from the magnetic field sensing circuit, the semiconductor substrate further having a second opposing surface proximal to the lead frame; and
at least two interconnects coupled between the primary conductor and the conductive layer, wherein a second portion of the primary current flows through the conductive layer and wherein the magnetic field sensing circuit comprises one or more magnetic field sensing elements to sense the second portion of the primary current;
wherein the magnetic field sensing circuit further comprises a calibration circuit configured to calibrate a sensitivity of the magnetic field sensing circuit in response to a difference between a measured level of the current sensor output signal for a selected primary current level and a predetermined level of the current sensor output signal for the selected primary current level.

20. The current sensor of claim 19, wherein the conductive layer comprises one or both of a coil and a trace.

21. The current sensor of claim 19, wherein a level of the second portion of the primary current is established in part based on a resistance value of the at least two interconnects.

22. The current sensor of claim 19, wherein the at least two interconnects comprise wire bonds.

23. The current sensor of claim 19, wherein the primary conductor and the at least two interconnects comprise the same material.

24. The current sensor of claim 19, wherein the magnetic field sensing circuit comprises a magnetic field sensing element comprising one or both of a Hall effect element and a magnetoresistance element.

25. The current sensor of claim 24, wherein the magnetoresistance element comprises one of or a combination of two or more of Indium Antimonide (InSb), a giant magnetoresistance (GMR) element, an anisotropic magnetoresistance (AMR) element, a tunneling magnetoresistance (TMR) element, and a magnetic tunnel junction (MTJ) element.

26. The current sensor of claim 19, wherein the magnetic field sensing circuit is configured to sense a magnetic field in first and second directions, and wherein a difference between a strength of the magnetic field in the first and second directions is proportional to the second portion of the primary current.

27. The current sensor of claim 19, wherein an output voltage of the current sensor is proportional to the primary current.

28. The current sensor of claim 19, wherein primary conductor is spaced from the semiconductor substrate such that the primary conductor and the semiconductor substrate do not vertically overlap each other.

* * * * *

UNITED STATES PATENT AND TRADEMARK OFFICE
CERTIFICATE OF CORRECTION

PATENT NO. : 9,958,482 B1
APPLICATION NO. : 15/384427
DATED : May 1, 2018
INVENTOR(S) : Alexander Latham Page 1 of 2

It is certified that error appears in the above-identified patent and that said Letters Patent is hereby corrected as shown below:

On the Title Page

Abstract, Line 15 delete "of primary" and replace with --of the primary--.

In the Specification

Column 1, Line 17 delete "is a" and replace with --a--.

Column 2, Line 24 delete "sense to" and replace with --sense a--.

Column 2, Lines 59-60 delete "of primary" and replace with --of the primary--.

Column 10, Line 50 delete "trace formed" and replace with --trace can be formed--.

Column 12, Line 34 delete "that is" and replace with --that it--.

Column 13, Line 34 delete "by from" and replace with --by--.

Column 13, Line 65 delete "FIG. 0.4," and replace with --FIG. 4,--.

Column 14, Line 7 delete "effect 552a" and replace with --effect element 552a--.

Column 14, Line 10 delete "corresponding the" and replace with --corresponding to the--.

Column 14, Line 18 delete "55a." and replace with --555a.--.

Column 14, Line 20 delete "sensing in" and replace with --sensed in--.

Column 14, Line 37 delete "55a" and replace with --555a--.

Signed and Sealed this
Thirtieth Day of October, 2018

Andrei Iancu
*Director of the United States Patent and Trademark Office*

Column 14, Line 39 delete "452a" and replace with --555a--.

Column 15, Line 15 delete "by from" and replace with --by--.

Column 16, Line 25 delete "top" and replace with --to--.

Column 16, Line 27 delete "top" and replace with --to--.

Column 17, Line 15 delete "by from" and replace with --by--.

Column 18, Line 16 delete "compared the" and replace with --compared to the--.

Column 18, Line 43 delete "compared the" and replace with --compared to the--.

In the Claims

Column 21, Line 7 delete ", wherein primary" and replace with --, wherein the primary--.